US011800675B2

(12) United States Patent
Pham et al.

(10) Patent No.: US 11,800,675 B2
(45) Date of Patent: Oct. 24, 2023

(54) COMPUTE NODE HAVING A CHASSIS WITH FRONT INSTALLED GPU TRAY (71) Applicant: HEWLETT PACKARD ENTERPRISE DEVELOPMENT LP, Houston, TX (US)

(72) Inventors: Kenny Huy Pham, Houston, TX (US); Earl W. Moore, Houston, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

(21) Appl. No.: 17/807,219

(22) Filed: Jun. 16, 2022

(65) Prior Publication Data

US 2022/0312624 A1  Sep. 29, 2022

Related U.S. Application Data (62) Division of application No. 16/912,869, filed on Jun. 26, 2020, now Pat. No. 11,395,431.

(51) Int. Cl.
*H05K 7/14* (2006.01)
*H05K 5/03* (2006.01)
*H05K 5/02* (2006.01)

(52) U.S. Cl.
CPC ......... *H05K 7/1489* (2013.01); *H05K 5/0221* (2013.01); *H05K 5/0291* (2013.01); *H05K 5/03* (2013.01); *H05K 7/1487* (2013.01)

(58) Field of Classification Search
CPC .................................................. H05K 5/00
See application file for complete search history.

(56) References Cited

U.S. PATENT DOCUMENTS

| | | | |
|---|---|---|---|
| 9,706,678 B1* | 7/2017 | Chen | H05K 7/1491 |
| 2009/0244862 A1 | 10/2009 | Wu et al. | |
| 2014/0168883 A1 | 6/2014 | Boswell et al. | |
| 2014/0204537 A1* | 7/2014 | Rust | H05K 7/02 361/727 |
| 2015/0331459 A1* | 11/2015 | Ross | G11B 33/128 361/679.32 |
| 2016/0192532 A1 | 6/2016 | Tseng et al. | |

(Continued)

FOREIGN PATENT DOCUMENTS

| | | |
|---|---|---|
| CN | 103872521 A | 6/2014 |
| CN | 104915320 A | 9/2015 |

(Continued)

*Primary Examiner* — Jerry Wu
(74) *Attorney, Agent, or Firm* — Hewlett Packard Enterprise Patent Department (57) ABSTRACT Example implementations relate to a compute node having a chassis with front installed trays. The chassis includes a base, a pair of walls, each coupled to a peripheral side of the base, and a first top cover portion coupled to the pair of walls to cover a portion of the chassis. The compute node further includes a plurality of first latches coupled to a rear end inner surface of the first top cover portion. The plurality of trays is slidable from a front side of the chassis and at least one tray is fastened to at least one first latch. Each tray includes a front cover, a floor coupled to the front cover, a pair of brackets coupled to the floor, a pair of risers, where each riser is coupled to a respective bracket, and a pair of GPU card assemblies, where each GPU card assembly is plugged to a respective riser.

20 Claims, 7 Drawing Sheets

(56) References Cited

U.S. PATENT DOCUMENTS

| 2016/0262282 A1 | 9/2016 | Li et al. |
| 2018/0228045 A1 | 8/2018 | Youzhi |
| 2019/0294219 A1 | 9/2019 | Tsorng et al. |

FOREIGN PATENT DOCUMENTS

| CN | 105739644 A | 7/2016 |
| CN | 107704036 A | 2/2018 |
| CN | 107943226 A | 4/2018 |
| CN | 108419405 A | 8/2018 |
| CN | 108463077 A | 8/2018 |
| CN | 108519802 A | 9/2018 |
| CN | 208224949 U | 12/2018 |
| CN | 109116937 A | 1/2019 |
| CN | 109656332 A | 4/2019 |

* cited by examiner

COMPUTE NODE HAVING A CHASSIS WITH FRONT INSTALLED GPU TRAY

BACKGROUND

A graphics processing unit (GPU) card assembly is a specialized electronic circuit used to rapidly process graphics instructions of an application. In general, the GPU card assembly may discharge a main processor of a compute node from processing the application's graphics processing instructions. Thus, without an adequate number of GPU card assemblies, processing the graphics instructions, such as software emulation, rendering, video processing, and visualization may occupy a significant portion of the main processor bandwidth, thereby resulting in unacceptably low performance of the compute node.

BRIEF DESCRIPTION OF THE DRAWINGS

Various examples will be described below with reference to the following figures.

DETAILED DESCRIPTION

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing examples only and is not intended to be limiting. As used herein, the singular forms "a," "an," and "the" are intended to include the plural forms as well, unless the context clearly indicates otherwise. The term "plurality," as used herein, is defined as two, or more than two. The term "another," as used herein, is defined as at least a second or more. The term "coupled," as used herein, is defined as connected, whether directly without any intervening elements or indirectly with at least one intervening elements, unless otherwise indicated. Two elements may be coupled mechanically, electrically, or communicatively linked through a communication channel, pathway, network, or system. The term "and/or" as used herein refers to and encompasses any and all possible combinations of one or more of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

It may be noted herein that the term "full-length graphical processing unit (GPU) card assembly" may refer to a length of the GPU card assembly. In some examples, this may be about three hundred twelve millimeters. Further, the term "dual slot GPU card assembly" may refer to a GPU card assembly that occupies two peripheral component interconnect express (PCIe) slots of a mother board. The term "modular tray" may refer to a standardized uniform size and design of the tray that may be independently installed in multiple ways within a matrix housing of the chassis. Further, the term "front side" of the compute node may refer to a side of the compute node i) having a display section for providing easy access to frequently used devices of the compute node, such as power switch, USB ports, and show other relevant information about the compute node to the user, ii) readily visible to the user when mounted on rack or enclosure of a datacenter, and iii) having one or more clamps for enabling the compute node to be clamped to the rack or enclosure of the data center. Similarly, the term "rear side" of the compute node may refer to a mutually opposite side of the front side of the compute node i) having rarely accessed ports, such as network and power ports to connect the compute node to the respective supply unit, and ii) concealed from the user when installed in the rack or enclosure of the data center.

The present disclosure describes example implementations of a compute node hardware, and more specifically, to modular graphics processing unit (GPU) trays for installing a maximum number of GPU card assemblies within a chassis of the compute node. For example, each of the modular trays may support at least two GPU card assemblies and risers, and may be detachably coupled to the chassis by way of sliding the tray into a recess formed at a front side of the chassis. In some examples, the chassis may have one rack unit height (1 U or 1 Uspace) or two rack unit height. However, each of the modular trays may have one rack unit height. In other words, the compute node when installed in a data center may take up 1 U or 2 U rack space out of a standard 42 U rack space available in a rack. In one example, a first portion of the chassis (having a single housing) located at the front side, is segregated into two halves to define a "1×2" matrix housing having two sub-housings. In such examples, the compute node may include two trays disposed in the "1×2" matrix housing, thereby supporting four GPU card assemblies. Similarly, in some other examples, the first portion of the chassis (having the single housing) is segregated into four halves to define a "2×2" matrix housing having four sub-housings. In such examples, the compute node may include four trays disposed in the "2×2" matrix housing, thereby supporting eight GPU card assemblies. In one or more examples, each of the GPU card assemblies may be a full-length dual slot GPU card assembly. It may be noted herein that the term "GPU tray" and "tray" may be used interchangeably.

For purposes of explanation, certain examples are described with reference to the devices illustrated in FIGS. 1-4. The functionality of the illustrated devices may overlap, however, and may be present in a fewer or greater number of elements and devices. Further, all or part of the functionality of illustrated elements may co-exist or be distributed among several geographically dispersed locations. Moreover, the disclosed examples may be implemented in various environments and are not limited to the illustrated examples. Thus, the present disclosure merely sets forth possible examples of implementations, and many variations and modifications may be made to the described examples. Such modifications and variations are intended to be included within the scope of this disclosure and protected by the following claims.

With the development of artificial intelligence technology, edge computing technology, super computing technology, and the like, demand for GPU card assemblies for processing graphics instructions in a compute node are ever increasing. Thus, more and more GPU card assemblies are installed in the compute node for processing the graphics instructions, thereby increasing the density of the GPU card assemblies in the compute node. The GPU card assemblies is located at a rear end of the compute node and arranged sequentially along a width of the compute node or radially along a height of the compute node, where each GPU card assembly is docked to a motherboard of the compute node through a respective riser. However, due to limited size and standard specification of a rack of a data center, an internal space of the compute node is also limited. Since the rear end of the compute node has to additionally support other components, such as power supply units, various peripheral component interconnect express (PCIe) cards, and the like, the GPU card assemblies may not be able to make full use of the internal space available at the rear end of the compute node. Additionally, since the motherboard and other accessories are also located proximate to the rear end of the compute node, the GPU card assemblies of either a half-length or three-fourth length may only be arranged sequentially or radially at the rear end of the compute node. Further, the compute nodes having a 1 U height can only support a single slot GPU card assemblies, if two numbers of the GPU card assemblies are to be stacked one above another in the radial direction. Thus, this type of compute node cannot support maximum number of the GPU card assemblies, for example, full-length dual slot GPU card assemblies, due to the internal space constraints of the compute node. Further, during installation of the GPU card assemblies or during maintenance of the GPU card assemblies, a back panel and a top cover of the compute node may have to be removed from a chassis of the compute node for providing clearance to access the internal space at the rear end of the compute node. With too many other components of the compute node located proximate to the GPU card assemblies, and the GPU card assemblies also been stacked in the radial direction, it may be laborious and intensive task for a customer or a technician to install or remove the GPU card assemblies from the compute node.

A technical solution to the aforementioned issues may include implementing a compute node having a chassis with a plurality of front installed modular trays, where each tray may support a pair of GPU card assemblies. In some examples, the chassis and each modular tray may have 1 U height. In such examples, the compute node may support two modular trays that are arranged in a form of a "1×2" matrix at a front side of the chassis. Thus, the chassis having the 1 U height may support four GPU card assemblies. In some other examples, the chassis may have 2 U height and each tray may have the 1 U height. In such examples, the compute node may support four modular trays that are arranged in a form of a "2×2" matrix at the front side of the chassis. Thus, the chassis having the 2 U height chassis may support eight GPU card assemblies. In one or more examples, each of the GPU card assemblies may be a full-length dual slot GPU card assembly. Since, the front installed modular tray design of the compute node, make full use of an internal space at the front side of the compute node, the compute node may support maximum number of the full-length dual slot GPU card assembly within the chassis. Additionally, each modular tray may be detachably coupled to a chassis of the compute node, by sliding into a recess formed at a front side of the chassis. Thus, the slidable and detachable front installed GPU tray design may improve the serviceability of the compute node and save the customer's or technician's time during service events and configuration events of the compute node.

In some examples, the compute node include a chassis, a plurality of first latches, and a plurality of trays. The chassis may include a base, a pair of walls, each coupled to a peripheral side of the base, and a first top cover portion coupled to the pair of walls to cover a portion of the chassis. The plurality of first latches is coupled to a rear end inner surface of the first top cover portion. The plurality of trays is slidable from a front side of the chassis. Further at least one tray is fastened to at least one first latch. Each tray may include a front cover, a floor coupled to the front cover, a pair of brackets coupled to the floor, a pair of risers, each coupled to a respective bracket of the pair of brackets, and a pair of graphics processing unit (GPUs) card assemblies. Each GPU card assembly is plugged into a respective riser of the pair of risers.

Figure 1A:
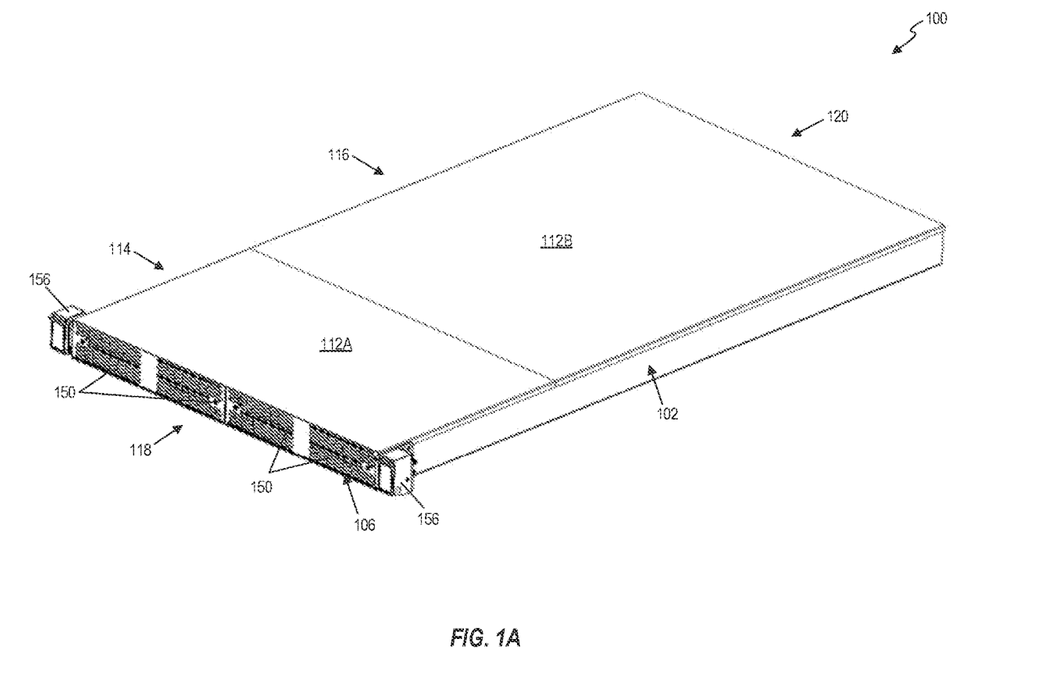
FIG. 1A illustrates a schematic diagram of a compute node, in accordance to some examples of the present disclosure.
Figure 1B:
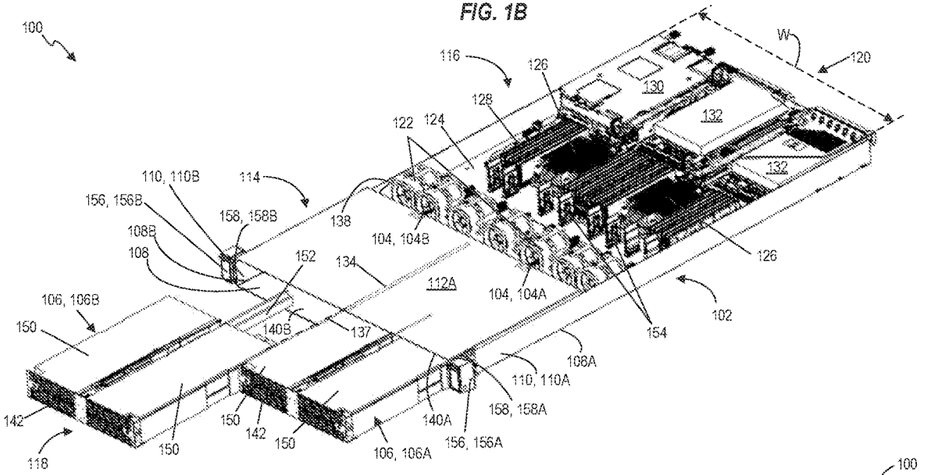
FIG. 1B illustrates an isometric view of the compute node of FIG. 1A having a chassis with a plurality of front installed GPU trays, in accordance to some examples of the present disclosure.
Figure 1C:
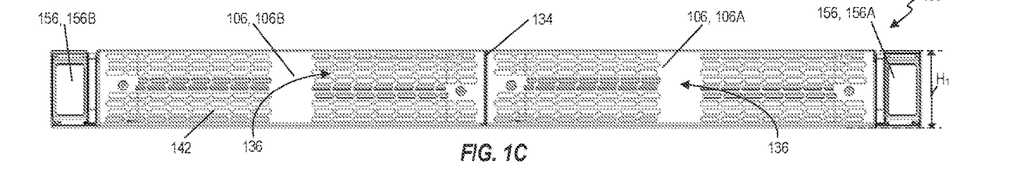
FIG. 1C illustrates a front view of the compute node of FIGS. 1A and 1B, in accordance to some examples of the present disclosure.

FIG. 1A is a schematic diagram of a compute node 100 in accordance to some examples of the present disclosure. FIG. 1B is an isometric view of the compute node 100 of FIG. 1A in accordance to some examples of the present disclosure. FIG. 1C is a front view of the compute node 100 of FIGS. 1A and 1B, in accordance to some examples of the present disclosure.

In one or more examples, the compute node 100 is a high-performance computing system having a plurality of graphical processing unit (GPU) card assemblies 150 (as shown in FIG. 1B), which is loaded to a rack of a data center for performing intended functions or providing dedicated services. In certain examples, the GPU card assemblies 150 may include a plurality of electronic devices to rapidly process visual data of one or more applications used by some latest technologies, such as artificial intelligence, edge computing, super-computing, and the like. In other words, the GPU card assemblies 150 may be used to boost the performance of the compute node 100 by offloading visual data-processing tasks from main processors 126 (as shown in FIG. 1B) of the compute node 100 to the GPU card assemblies 150. Thus, freeing up the main processors 126 of the compute node 100 to perform other non-visual data-processing tasks. In some examples, the compute node 100 includes a chassis 102, a plurality of latches 104 (as shown in FIG. 1B), and a plurality of trays 106. It may be noted herein that the terms "plurality of latches" and "plurality of first latches" may be used interchangeably.

The chassis 102 may include a base 108 (as shown in FIG. 1B), a pair of walls 110 (one wall of the pair of walls 110 is shown in FIG. 1A), a first top cover portion 112A, and a second top cover portion 112B. Each wall of the pair of walls 110 is coupled to a peripheral side of the base 108. For example, a first wall 110A of the pair of walls 100 is coupled to a first peripheral side 108A of the base 108 and a second wall 110B of the pair of walls 100 is coupled to a second peripheral side 108B of the base 108. The first top cover portion 112A is disposed over the pair of walls 110 and rigidly coupled to the pair of walls 110 to cover a portion 114 of the chassis 102. In some examples, the portion 114 of the chassis 102 may also be referred to as a first portion of the chassis 102. The first top cover portion 112A is disposed proximate to a front side 118 of the chassis 102 such that it substantially covers the pair of trays 106.

In an example of FIG. 1B, the compute node 100 may further include a plurality of fans 122, a mother board 124, main processors 126, a plurality of dual in-line memory module units (DDIMs) 128, a power supply unit 130, and a plurality of peripheral component interconnect express (PCIe) cards 132. In some examples, the plurality of fans 122 may be disposed sequentially along a width "W" of the chassis 102. The mother board 124 may be disposed proximate to the plurality of fans 122 and coupled to the base 108. The main processors 126 and the DDIMs 128 may be directly plugged to the mother board 124. The power supply unit 130 and the PCIe cards 132 are disposed adjacent to one another at the rear side 120 of the chassis 102 and coupled to the base 108. In such examples, the second top cover portion 112B is disposed over the pair of walls 110, adjacent to the first top cover portion 112A, and detachably coupled to the pair of walls 110 to cover a remaining portion 116 of the chassis 102. In some examples, the remaining portion 116 of the chassis 102 may also be referred to as a second portion of the chassis 102. The second top cover portion 112B is disposed proximate to a rear side 120 of the chassis 102 such that it substantially covers other components of the compute node 100, such as the plurality of fans 122, the mother board 124, the main processors 126, the DDIMs 128, the power supply units 130, and the PCIe cards 132. Further, the second top cover portion 112B when detached from the chassis 102 may provide access to the plurality of first latches 106.

The chassis 102 further includes an intermediate wall 134 disposed at a middle section 137 of the base 108. It may be noted herein that for the ease of illustration, the intermediate wall 134 is shown in dotted line on the first top cover portion 112A, and such illustration should not be construed as limitation of the present disclosure. The intermediate wall 134 may be coupled to the front top cover portion 112A and the base 108 to define a "1×2" matrix housing 136 (as shown in FIG. 1C) within the portion 114 of the chassis 102. The term "1×2" matrix housing 136 refers to two sub-housings, which are organized in one row and two columns, such that each sub-housing may hold one tray of the plurality of trays 106.

The plurality of latches 104 is coupled to a rear end inner surface 138 of the first top cover portion 112A. In the example of FIG. 1B, the plurality of latches 104 includes one latch 104A and another latch 104B. It may be noted herein that herein that the term one latch 104A may also be referred to as "a first latch 104A" and other latch 104B may also be referred to as "a second latch 104B". In one or more examples, the plurality of latches 104 may be used to fasten the plurality of trays 106 to the chassis 102.

The plurality of trays 106 is slidable into the matrix housing 136 from the front side 118 of the compute node 100. In the example of FIG. 1B, the plurality of trays 106 includes a first tray 106A and a second tray 106B. Each of first and second trays 106A, 106B may slide into a first recess 140A and a second recess 140B defined by the matrix housing 136. Further, the first and second trays 106A, 106B may be fastened to the first portion 114 of the chassis 102 via the first and second latches 104A, 104B respectively.

Figure 2A:
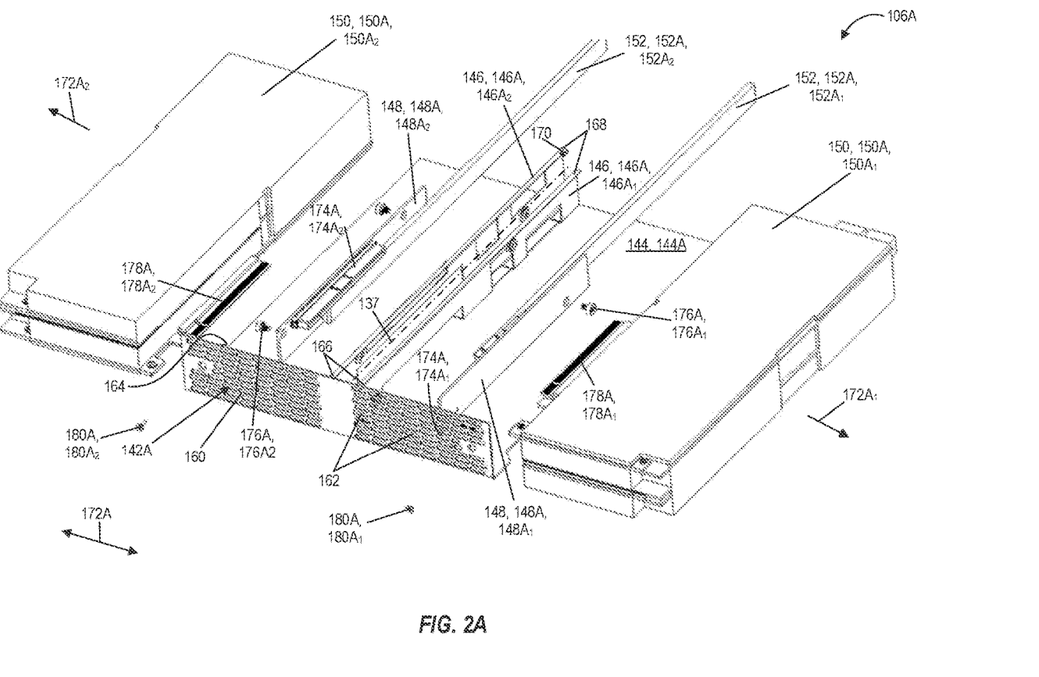
FIG. 2A illustrates an exploded view of one GPU tray of FIG. 1B, in accordance to some examples of the present disclosure.

In one or more examples, each of the plurality of trays 106 includes a front cover 142, a floor 144 (as shown in FIG. 2A), a pair of brackets 146 (as shown in FIG. 2A), a pair of risers 148 (as shown in FIG. 2A), and a pair of graphics processing unit (GPU) card assemblies 150. The floor 144 may be coupled to the front cover 142 and a pair of brackets 146. Similarly, each riser of the pair of risers 148 may be coupled to a respective bracket of the pair of brackets 146. Further, each GPU card assembly of the pair of GPU card assemblies 150 may be plugged to a respective riser of the pair of risers 148. In some examples, each of the plurality of trays 106 may further include a plurality of cables 152. In such examples, each cable of the plurality of cables 152 may be plugged to the respective riser of the plurality of risers 148 and route from the respective riser 148 to a respective switch of a plurality of switches 154 disposed on the mother board 126. It may be noted herein that the plurality of trays 106 are discussed in greater details below.

In some examples, the chassis 102 of the compute node 100 has a height "$H_1$" that is substantially equal to one rack unit height (1 U) of a rack space available in a rack. For example, the 1 U rack height may be about 44 millimeter. Further, the compute node 100 includes a pair of clamps 156, for example, a first clamp 156A and a second clamp 156B. Each clamp of the first and second clamps 156 may be disposed at the front side 118 of the chassis 102 and coupled to a peripheral ends 158, for example, a first peripheral end 158A and a second peripheral end 158B of a respective wall of the pair of walls 110. In one or more examples, the pair of clamps 156 is configured to fasten the compute node 100 to a rack (not shown in FIGS) of a data center.

In some examples, each of the plurality of trays 106 is modular component. That means, each of the plurality of trays 106 may be separately assembled with the trays components, such as the pair of risers 148, the pair of GPU card assemblies 150, and the plurality of cables 152 on the floor 144 and coupled to the pair of brackets 146. Later the assembled tray 106 may be detachably coupled to the chassis 102 via the plurality of latches 104, by sliding the tray 106 into the matrix housing 136 from the front side 118 of the compute node 100.

Figure 2B:
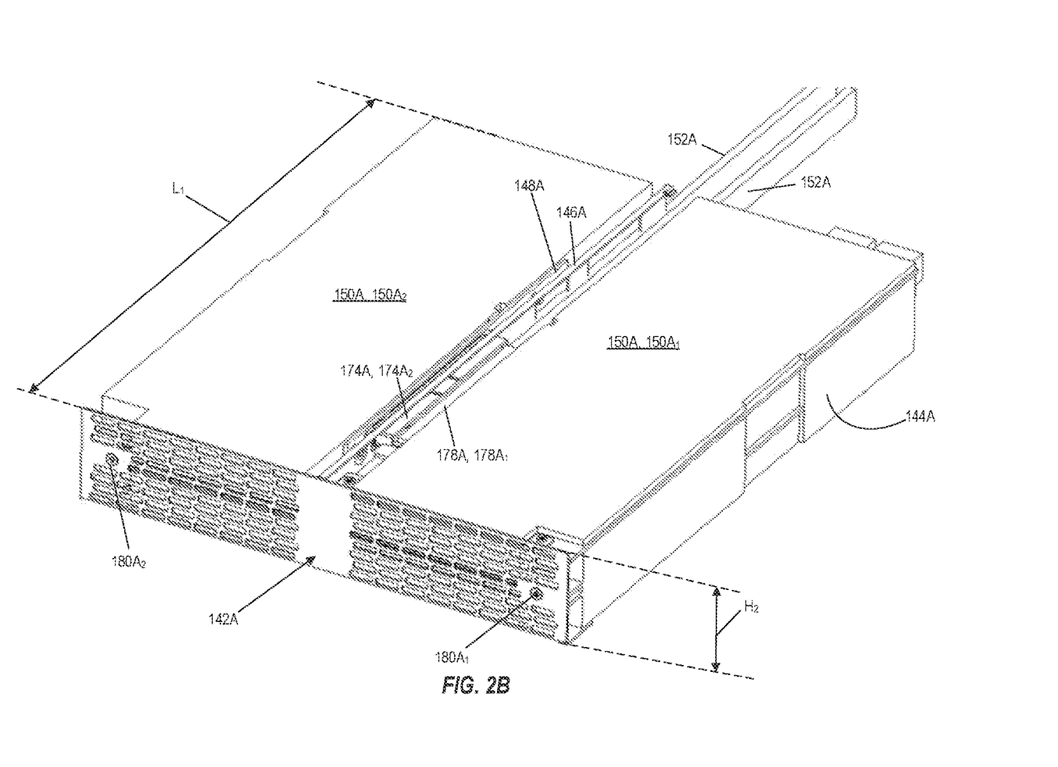
FIG. 2B illustrates an assembled view of the GPU tray of FIG. 2A, in accordance to some examples of the present disclosure.

FIG. 2A is an exploded view of one of a plurality of trays 106, for example, a first tray 106A in accordance to some examples of the present disclosure. FIG. 2B is an assembled view of the first tray 106A of FIG. 2A in accordance to some examples of the present disclosure.

In some examples, the first tray 106A includes a first front cover 142A, a first floor 144A, a pair of first brackets 146A, a pair of first risers 148A (as shown in FIG. 2A), and a pair of first graphics processing unit (GPU) card assemblies 150A. In the example of FIGS. 2A and 2B, the pair of first brackets 146A includes a first bracket 146A$_1$ and a second bracket 146A$_2$. Similarly, the pair of first risers 148A includes a first riser 148A$_1$ and a second riser 148A$_2$. Further, the pair of first GPU card assemblies 150A includes a first GPU card assembly 150A$_1$ and a second GPU card assembly 150A$_2$.

The first front cover 142A is a rectangular sheet metal component. Further, the first front cover 142A has a display section 160 having a plurality of perforations 162, and an electromagnetic induction (EMI) gasket 164 coupled along a perimeter of the display section 160. Heat generated during the operation of the compute node 100 may be dissipated through air entering and/or discharging from the plurality of perforations 162. The EMI gasket 164 protect the electronic components, for example, the pair of first risers 148A and the pair of GPU card assemblies 150A from electromagnetic interference.

The first floor 144A has a substantially flat surface having provisions, such as holes and the like, to hold other components of the first tray 106A. In some examples, the first floor 144A is rigidly coupled to the first front cover 142A of the chassis 102 (as shown in FIG. 1B). For example, the first front cover 142A is aligned perpendicularly to the first floor 144A and coupled to a front peripheral end portion of the first floor 144A. In some other examples, the first floor 144A and the first front cover 142A may be integrated to one another as a monolithic component. In one or more examples, the first floor 144A may be formed by a sheet metal component.

The pair of first brackets 146A may function as extended arms of the first tray 106A, which stretch between the vertically oriented first front cover 142A and the horizontally oriented first floor 144A. Each bracket of the pair of first brackets 146A has a front end 166 and a rear end 168. In some examples, at least one bracket of the pair of first brackets 146A includes a protruded section 168 at the rear end 168. For example, the second bracket 146A$_2$ of the pair of first brackets 146A has the protruded section 170 extending along a lateral direction 172A. Further, each bracket of the pair of first brackets 146A may include one or more provisions, such as holes, and the like, to hold other components of the tray 106A. In one example, the pair of first brackets 146A is disposed proximate to a middle section 137 of the first floor 144A. Further, the pair of first brackets 146A may be coupled to the first floor 144A via fasteners, welding, and the like.

Each riser of the pair of first risers 148A may have one or more provisions, such as a connector socket 174A that may allow the addition of one or more first GPU card assemblies 150A in a horizontal orientation instead of a vertical orientation, so as to accommodate the internal space constraints of the chassis 102. For example, the first riser 148A$_1$ includes a first connector socket 174A$_1$ and the second riser 148A$_2$ includes a second connector socket 174A$_2$. In some examples, the pair of first risers 148A may function as an intermediate electronic circuitry to the mother board 124 (as shown in FIG. 1B) and the one or more first GPU card assemblies 150A. In the example of FIGS. 2A and 2B, the first riser 148A$_1$ is disposed upside down, such that the first connector socket 174A$_1$ is located upwards i.e., away from the first floor 144A, wherein the second connector socket 174A$_2$ of the second riser 148A$_2$ is located downwards i.e., proximate to the first floor 144A. In some examples, each of the first connector sockets 174A may be a peripheral component interconnect express (PCIe) socket. In one or more examples, the pair of first risers 148A may be a semiconductor circuit card. Further, each riser of the pair of first risers 148A may also include one or more provisions, such as holes, and the like, to hold other components of the tray 106A. In such examples, each riser of the pair of first risers 148A is coupled to a respective bracket of the pair of first brackets 146 via fasteners 176A. For example, the first riser 148A$_1$ is coupled to the first bracket 146A$_1$ via a first fastener 176A$_1$ and the second riser 148A$_2$ is coupled to the second bracket 146A$_2$ via a second fastener 176A$_2$.

In some examples, each GPU card assembly of the pair of first GPU card assemblies 150A may have a specialized electronic circuit and processors that may rapidly process graphics instructions of an application. Thus, the pair of first GPU card assemblies 150A may discharge the main processors 126 (as shown in FIG. 1B) of the compute node 100, from processing the application's graphics processing instructions. In other words, the pair of first GPU card assemblies 150A may reduce the main processors 126 from processing most of the graphics processing instructions, such as software emulation, rendering, video processing, and visualization. Thus, resulting in discharge a significant portion of the main processors 126 bandwidth, and thereby increase the performance of the compute node 100. Each of the pair of first GPU card assemblies 150A includes a connector plug 178A. For example, the first GPU card assembly 150A$_1$ includes a first connector plug 178A$_1$ and the second GPU card assembly 150A$_2$ includes a second connector plug 178A$_2$. In the example of FIGS. 2A and 2B, the first GPU card assembly 150A$_1$ is disposed upside down, such that the first connector plug 178A$_1$ is located upwards i.e., away from the first floor 144A, wherein the second connector plug 178A$_2$ of the second GPU card assembly 150A$_2$ is located downwards i.e., proximate to the first floor 144A. For example, the first connector plug 178A$_1$ of the first GPU card assembly 150A$_1$ faces the second connector socket 174A$_2$ of the second riser 148A$_2$, and the second connector plug 178A$_2$ of the second GPU card assembly 150A$_2$ faces the first connector socket 174A$_1$ of the first riser 148A$_1$. Further, the first GPU card assembly 150A$_1$ and the first riser 148A$_1$ are disposed along one lateral side 172A$_1$ of the pair of first brackets 146A, and the second GPU card assembly 150A$_2$ and the second riser 148A$_2$ are disposed along another lateral side 172A$_2$ of the pair of first brackets 146A. In some examples, each of the first connector plug 178A may be a peripheral component interconnect express (PCIe) plug. Further, the pair of first GPU card assemblies 150A may be plugged to a respective riser of the pair of first risers 148A. For example, the first GPU card assembly 150A$_1$ is plugged to the second riser 148A$_2$, and the second GPU card assembly 150A$_2$ is plugged to the first riser 148A$_1$. In such examples, the first connector plug 178A$_1$ of the first GPU card assembly 150A$_1$ is plugged to the second connector socket 174A$_2$ of the second riser 148A$_2$. Similarly, the second connector plug 178A$_2$ of the second GPU card assembly 150A$_2$ is plugged to the first connector socket 174A$_1$ of the first riser 148A$_1$. In some examples, the first and second GPU card assemblies 150A$_1$ and 150A$_2$ may slide on the first floor 144A along the lateral direction 172A to plug to the first and second risers 148A$_1$ and 148A$_2$ respectively and unplug from the first and second risers 148A$_1$ and 148A$_2$ respectively.

In some examples, the first tray 106A may further include a plurality of first cables 152A. In such examples, each cable of the plurality of first cables 152A may be plugged to the respective riser of the plurality of first risers 148A and route from the respective first riser 148A to a respective switch of a plurality of first switches 154 (as shown in FIG. 1B) disposed on the mother board 126. For example, the first cable 152A$_1$ may extend from the first riser 148A$_1$ and the second cable 152A$_2$ may extend from the second riser 148A$_2$.

Referring to FIG. 2B, in some examples, each tray of the plurality of trays 106 has a second height "H$_2$". For example, the first tray 106A has the second Height "H$_2$" that is substantially equal to one rack unit height (1 U) of the rack space available in a rack. In one or more examples, the 1 U rack height may be about 44 millimeter. Further, each GPU card assembly of the pair of GPU card assemblies 150 has a length "L$_1$". For example, the first and second GPU card assemblies 150A$_1$ and 150A$_2$ has the length "L$_1$". In one or more examples, the length "L$_1$" may be a full-length, which may be about three hundred twelve millimeters. Similarly, each GPU card assembly of the pair of GPU card assemblies 150 may be a dual slot GPU card assembly. For example, each of the first and second GPU card assemblies 150A$_1$ and 150A$_2$ is the dual slot GPU card assembly.

The first floor 144A is coupled to the first front cover 142A and a pair of first brackets 146A. Further, each riser of the pair of risers 148A is coupled to a respective bracket of the pair of brackets 146A. Each GPU card assembly of the pair of GPU card assemblies 150A is plugged to a respective riser of the pair of risers 148. Similarly, each cable of the plurality of first cables 152A is plugged to the respective riser of the plurality of risers 148A and route from the respective riser 148A to a respective switch of a plurality of switches 154 (as shown in FIG. 1B) disposed on the mother board 126 (as shown in FIG. 1B). Further, each GPU card assembly 150 is coupled to the front cover 142A via a plurality of fasteners 180A to retain a respective GPU card assembly within the chassis 102. For example, the first GPU card assembly 150A$_1$ is coupled to the front tray 142A via the fastener 180A$_1$ and the second GPU card assembly 150A$_1$ is coupled to the front tray 142A via the fastener 180A$_2$.

In one or more examples, of the present disclosure the compute node 100 having the chassis 102 of 1 U height can accommodate four full-length dual slot GPU card assemblies 150. Since, each tray of the plurality of trays 106 can support and/or hold two GPU card assemblies 150 within the front portion 114 of the chassis 102, the compute node 100 of the present disclosure may accommodate four full-length dual slot GPU card assemblies 150. Thus, the GPU card assemblies 150A may optimally use the internal space available at the front side 118 of the chassis 102 for support maximum number of GPU card assemblies 150. Since, each tray 106 may be easily latched by sliding into the chassis 102 and unlatched from the chassis 102 by sliding back from the chassis 102, the pair of GPU card assemblies 150 disposed on the tray 106, may be easily installed or removed within the housing matrix 136. Thus, improving the serviceability of the compute node 100 and save the customer or technician's time during service events and configuration of the compute node 100.

Figure 3A:
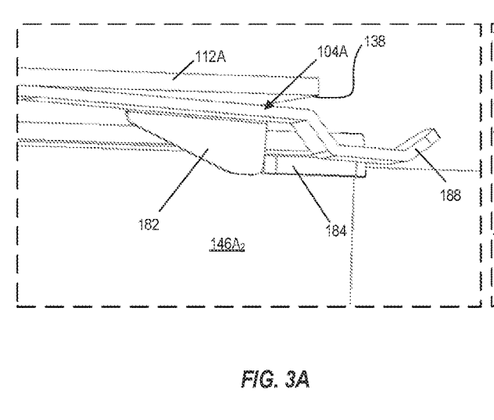
FIG. 3A illustrates a schematic diagram of a portion of a bracket and a latch of FIGS. 1B, 2A, and 2B, in accordance to some examples of the present disclosure.

FIG. 3A is a schematic diagram of a portion of a second bracket 146A$_2$ and a first latch 104A$_1$ of FIGS. 1B, 2A, and 2B in accordance to some examples of the present disclosure. Similarly, FIG. 3B is a schematic diagram of another portion of the second bracket 146A$_2$ and the first latch 104A$_1$ of FIGS. 1B, 2A, and 2B in accordance to some examples of the present disclosure.

Figure 3B:
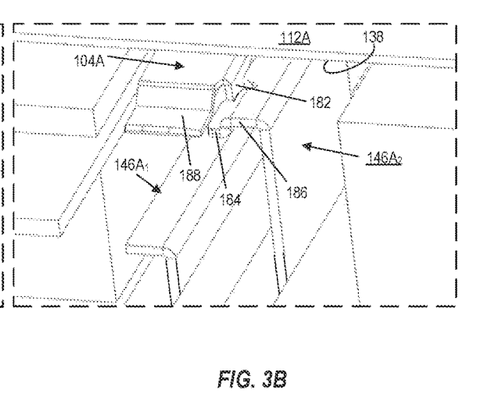
FIG. 3B illustrates a schematic diagram of another portion of the bracket and the latch of FIGS. 1B, 2A, and 2B, in accordance to some examples of the present disclosure.

In the examples of FIGS. 3A and 3B, a first latch 104A of the plurality of plurality of latches 104 is coupled to the rear end inner surface 138 of the first top cover portion 112A. The first latch 104A includes a protruded section 182 extending along a radial direction. Similarly, the second bracket 146A$_2$ of the pair of brackets 146A includes another protruded section 184 extending along a lateral direction at a rear end 186 of the second bracket 146A$_2$. During installation, the first tray 106A slides into one recess, for example, the first recess 140A (as shown in FIG. 1B) of the matrix housing 136, such that the protruded section 184 of the second bracket 146A$_2$ is engaged to the protruded section 182 of the first latch 104A, thereby fastening the first tray 106A to the chassis 102. During uninstallation, the second top cover portion 112B (as shown in FIG. 1B) may be detached from the chassis 102 so as to get access to the first latch 104A. Then, a handle section 188 of the first latch 104A is lifted upwards along the radial direction to disengage the protruded section 184 of the second bracket 146A$_2$ from the protruded section 182 of the first latch 104A, thereby releasing the first tray 104A from the chassis 102.

Figure 4A:
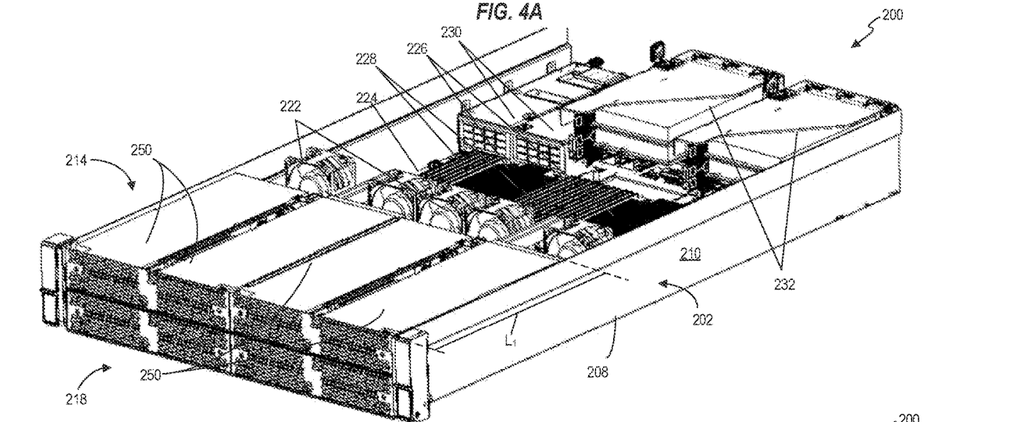
FIG. 4A illustrates an isometric view of a compute node having a chassis with a plurality of front installed GPU trays, in accordance to some other examples of the present disclosure.
Figure 4B:
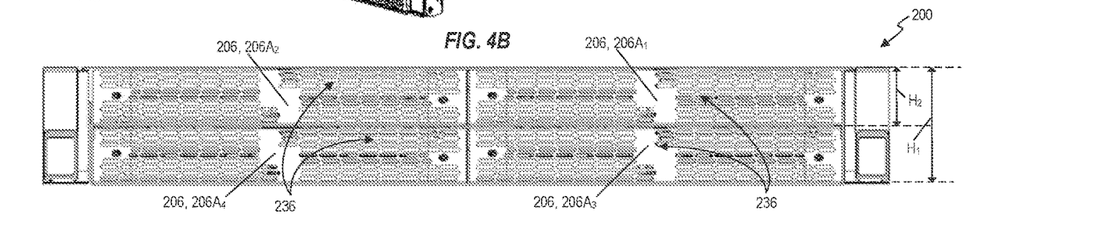
FIG. 4B illustrates a front view of the compute node of FIG. 4A, in accordance to some other examples of the present disclosure.
Figure 4C:
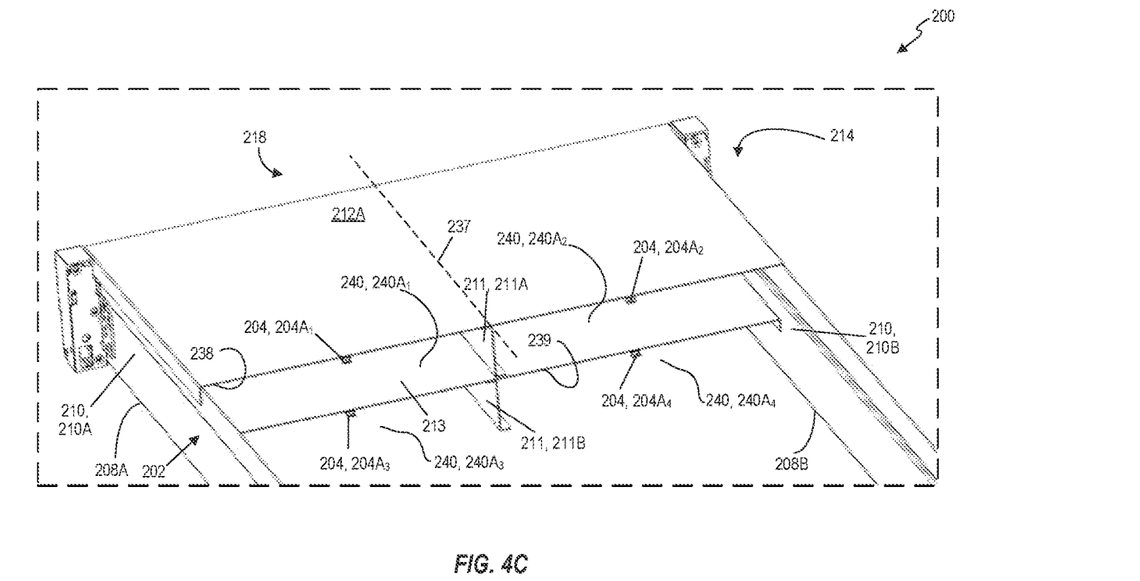
FIG. 4C illustrates a rear view of a portion of the compute node of FIG. 4A, in accordance to some other examples of the present disclosure.

FIG. 4A is an isometric view of a compute node 200 in accordance to some other examples of the present disclosure. FIG. 4B is a front view of the compute node 200 of FIG. 4A in accordance to some other examples of the present disclosure. FIG. 4C is a rear view of a portion of the compute node 200 of FIG. 4A in accordance to some other examples of the present disclosure. The compute node 200 includes a chassis 202, a plurality of latches 204 (as shown in FIG. 4C), and a plurality of trays 206. It may be noted herein that for the purpose of ease of illustration, the plurality of trays 206 (as shown in FIG. 4A) is not shown in the example of FIG. 4C, and such an illustration should not be construed as a limitation of the present disclosure.

As discussed in the example of FIG. 1B, the chassis 202 includes a base 208 (as shown in FIG. 2B), a pair of walls 210 (one wall of the pair of walls 210 is shown in FIG. 4A), a first top cover portion 212A (as shown in FIG. 4C), and a second top cover portion 212B (not shown). In the example of FIG. 4A, the compute node 200 may further include other components, such as a plurality of fans 222, a mother board 224, main processors 226, a plurality of dual in-line memory module units (DDIMs) 228, power supply units 230, and a plurality of peripheral component interconnect express (PCIe) cards 232.

Referring to FIGS. 4A, 4B and 4C, the chassis 202 may further include an intermediate top cover 213, a pair of intermediate walls 211 including a first intermediate wall 211A, and a second intermediate wall 211B. Each wall of the pair of walls 210 is coupled to a peripheral side of the base 208. For example, a first wall 210A is coupled to a first peripheral side 208A of the base 208 and a second wall 210B is coupled to a second peripheral side 208B of the base 208. Further, the first top cover portion 212A is disposed over the pair of walls 210 and rigidly coupled to the pair of the walls 210 to cover a portion 214 of the chassis 202. In some examples, the portion 214 of the chassis 102 may also be referred to as a first portion of the chassis 202. The first top cover portion 212A is disposed proximate to a front side 218 of the chassis 102 such that it substantially covers the pair of trays 206. The intermediate top cover 213 is disposed spaced apart from the first top cover portion 212A, positioned below the first top cover portion 212A, and coupled to the pair of walls 210. Further, the pair of intermediate walls 211 is disposed one below another along a middle section 237 of the base 208. In such examples, the first intermediate wall 211A is coupled to the front top cover portion 212A and the intermediate top cover 213, and the second intermediate wall 211B is coupled to the intermediate top cover 213 and the base 208 to define a "2×2" matrix housing 236 within the portion 214 of the chassis 202. The term "2×2" matrix housing 236 refers to four sub-housings, which are organized in two rows and two columns, such that each sub-housing may hold one tray of the plurality of trays 206. In other words, the matrix housing 236 may define four recesses 240 at the front portion 214. In some examples, the four recesses 240 includes a first recess 240$A_1$, a second recess 240$A_2$, a third recess 240$A_3$, and a fourth recess 240$A_4$. In one or more examples, the plurality of latches 204 includes a first latch 204$A_1$, a second latch 204$A_2$, a third latch 204$A_3$, and a fourth latch 204$A_4$. The first and second recesses 204$A_1$ and 204$A_2$ respectively are coupled to a rear end inner surface 238 of the first top cover portion 212A. Similarly, the third and fourth recesses 204$A_3$ and 204$A_4$ respectively are coupled to a rear end inner surface 239 of the intermediate top cover 213.

The plurality of trays 206 is slidable into the matrix housing 236 from the front side 218 of the compute node 200. In the example of FIG. 4A, the plurality of trays 206 includes a first tray 206$A_1$, a second tray 206$A_2$, a fourth tray 206$A_3$, and fourth tray 206$A_4$. Each of first, second, third, and fourth trays 206$A_1$, 206$A_2$, 206$A_3$, and 206$A_4$ is substantially similar to the tray 106 as discussed herein above with respect to example of FIGS. 2A and 2B. For example, each of the first, second, third, and fourth trays 206$A_1$, 206$A_2$, 206$A_3$, and 206$A_4$ may include a front cover, a floor, a pair of brackets, a pair of risers, and a pair of graphics processing unit (GPU) card assemblies 250.

Referring to FIG. 4B again, the chassis 202 of the compute node 200 has a height "$H_1$" that is substantially equal to two rack unit height (2 U) of a rack space available in a rack. For example, the 2 U rack height may be about 88 millimeter. Further, each tray of the plurality of trays 206 has a second height "$H_2$". For example, the first tray 206$A_1$ has the second Height "$H_2$" that is substantially equal to one rack unit height (1 U) of the rack space available in a rack. Similarly, the third tray 206$A_3$ has the second Height "$H_2$" that is substantially equal to one rack unit height (1 U) of the rack space available in the rack. In one or more examples, the 1 U rack height may be about 44 millimeter. Referring to FIG. 4A, each GPU card assembly of the pair of GPU card assemblies 250 has a length "$L_1$". In one or more examples, the length "$L_1$" may be a full-length, which may be about three hundred twelve millimeters. Similarly, each GPU card assembly of the pair of GPU card assemblies 250 may be a dual slot GPU card assembly.

During installation, the first tray 206$A_1$ slides into the first recess 240$A_1$ of the matrix housing 236, such that at least one bracket of the first tray 206$A_1$ is detachably coupled to the first latch 204$A_1$, thereby fastening the first tray 206$A_1$ to the chassis 202. The second, third, and the fourth trays 206$A_2$, 206$A_3$, and 206$A_4$ respectively may also be installed in substantially similar manner as discussed hereinabove with respect to the first tray 206$A_1$. Thereby, fastening the second, third, and fourth trays 206$A_2$, 206$A_3$, and 206$A_4$ respectively to the chassis 202. During uninstallation, a second top cover portion 212B (not shown in FIG. 4C) of the chassis 202 may be detached from the compute node 200 so as to get access to the plurality of latches 204. Later, each of the plurality of latches 204 may be lifted upwards along a radial direction to disengage from a respective bracket of the plurality of trays 206, thereby releasing the each of the plurality of trays 206 from the chassis 202.

In one or more examples, of the present disclosure the compute node 200 having the chassis 202 of 2 U height can accommodate eight full-length dual slot GPU card assemblies 250. Since, each tray of the plurality of trays 206 can support and/or hold two GPU card assemblies 250 within the front portion 214 of the chassis 202, the compute node 200 of the present disclosure may accommodate eight full-length dual slot GPU card assemblies 250. Thus, the GPU card assemblies 250 may optimally use the internal space available at the front side 218 of the chassis 202 for support maximum number of GPU card assemblies 250. Further since, each tray 206 may be easily latched by sliding into the chassis 202 and unlatched from the chassis 202 by sliding back from the chassis 202, the pair of GPU card assemblies 250 disposed on the tray 206, may be easily installed or removed within the housing matrix 236. Thus, improving the serviceability of the compute node 200 and save the customer or technician's time during service events and configuration of the compute node 200.

Accordingly, the compute node of the present disclosure having a chassis of a 1 U height or a 2 U height may optimally use the internal space available at a front side of the chassis for support a maximum number of GPU card assemblies. Further, each tray of the compute node may be easily latched and unlatched to the chassis, thus improving the serviceability of the compute node and save the customer or technician's time during service events and configuration of the compute node.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. An apparatus comprising: a chassis for a compute node, the chassis comprising a first portion and a second portion, wherein the first portion is located at a front side of the chassis and segregated into two halves to define a "1×2" matrix housing, and wherein the chassis has a first height; a first latch and a second latch, each coupled to a rear end inner surface of the first portion; and a first tray and a second tray, each slidable from the front side of the chassis, wherein the first and second trays are disposed in the "1×2" matrix housing and fastened to the first and second latches respectively, wherein each of the first and second trays has a second height, wherein the first and second heights are substantially equal to one rack unit height, and wherein each of the first and second trays comprises: a front cover; a floor coupled to the front cover; a pair of brackets coupled to the floor; and a pair of risers comprising a first riser having a first connector socket and a second riser having a second connector socket, wherein each riser of the pair of risers is coupled to a respective bracket of the pair of brackets; wherein the pair of risers is configured to receive a pair of graphics processing unit (GPU) card assemblies coupled thereto such that a first connector plug of a first GPU card assembly of the pair of GPU card assemblies is plugged into the first connector socket and a second connector plug of a second GPU card assembly of the pair of GPU card assemblies is plugged into the second connector socket.

2. The compute node of claim 1, wherein a top cover portion of the second portion is detachable from the chassis to provide access to the first and second latches.

3. An apparatus comprising: a chassis for a compute node, the chassis comprising a first portion located at a front side of the chassis and segregated into four sections to define a "2×2" matrix housing, and wherein the chassis has a first height that is substantially equal to two rack unit height; a first latch, a second latch, a third latch, and a fourth latch, each coupled to a rear end inner surface of the first portion; and a first tray, a second tray, a third tray, and a fourth tray, each slidable from the front side of the chassis, wherein the first, second, third, and fourth trays are disposed in the four sections of the "2×2" matrix housing, respectively, and fastened to the first, second, third, and fourth latches respectively, wherein each of the first, second, third, and fourth trays has a second height that is substantially equal to one rack unit height, and wherein each of the first, second, third, and fourth trays comprises: a front cover; a floor coupled to the front cover; a pair of brackets coupled to the floor; and a pair of risers comprising a first riser having a first connector socket and a second riser having a second connector socket, wherein each riser of the pair of risers is coupled to a respective bracket of the pair of brackets; wherein the pair of risers is configured to receive a pair of graphics processing unit (GPU) card assemblies coupled thereto such that a first connector plug of a first GPU card assembly of the pair of GPU card assemblies is plugged into the first connector socket and a second connector plug of a second GPU card assembly of the pair of GPU card assemblies is plugged into the second connector socket.

4. The compute node of claim 1, wherein at least one bracket of the pair of brackets of the first tray comprises a protruded section at a rear end of the bracket to releasably engage to another protruded section of the first latch.

5. The compute node of claim 1, further comprising a second portion top cover detachably coupled to the pair of walls to cover at least part of the second portion of the chassis, and wherein the second portion top cover provides access to the first and second latches.

6. The compute node of claim 1, wherein the pair of brackets of the first tray is disposed proximate to a middle section of the floor of the first tray.

7. The compute node of claim 6, wherein a first bracket of the pair of brackets of the first tray is disposed on a first lateral side of the middle section of the floor of the first tray and a second bracket of the pair of brackets of the first tray is disposed on a second lateral side of the middle section of the floor of the first tray.

8. The compute node of claim 6, wherein, for each of the first and second trays:
in a coupled state of the pair of GPU card assemblies to the pair of risers of the respective tray, the first GPU card assembly and the second riser are disposed along one lateral side of the pair of brackets and the second GPU card assembly and the first riser are disposed along another lateral side of the pair of brackets.

9. The compute node of claim 8, wherein, for each of the first and second trays:
in a coupled state of the pair of GPU card assemblies to the pair of risers of the respective tray,
the first connector of the first GPU card assembly is overlapped in a vertical direction by the second connector socket of the second riser, the vertical direction being perpendicular to the floor of the respective tray, and
the second connector of the second GPU card assembly is overlapped in the vertical direction by the first connector socket of the first riser.

10. The compute node of claim 1, wherein, for each of the first and second trays: each GPU card assembly of the pair of GPU card assemblies of the respective tray is a full-length dual slot GPU card assembly.

11. The compute node of claim 3, wherein at least one bracket of the pair of brackets of the first tray comprises a protruded section at a rear end of the bracket to releasably engage to another protruded section of the first latch.

12. The compute node of claim 3, further comprising a second portion top cover detachably coupled to the pair of walls to cover at least part of the second portion of the chassis, and wherein the second portion top cover provides access to the first and second latches.

13. The compute node of claim 3, wherein, for each of the first, second, third, and fourth trays:
the pair of brackets is disposed proximate to a middle section of the floor.

14. The compute node of claim 13, wherein, for each of the first, second, third, and fourth trays:
a first bracket of the pair of brackets of the respective tray is disposed on a first lateral side of the middle section of the floor of the respective tray and a second bracket of the pair of brackets of the respective tray is disposed on a second lateral side of the middle section of the floor of the respective tray.

15. The compute node of claim 13, wherein, for each of the first, second, third, and fourth trays:
in a coupled state of the pair of GPU card assemblies to the pair of risers of the respective tray, the first GPU card assembly and the second riser are disposed along one lateral side of the pair of brackets and the second GPU card assembly and the first riser are disposed along another lateral side of the pair of brackets.

16. The compute node of claim 15, wherein, for each of the first, second, third, and fourth trays:
in a coupled state of the pair of GPU card assemblies to the pair of risers of the respective tray,
the first connector of the first GPU card assembly is overlapped in a vertical direction by the second connector socket of the second riser, the vertical direction being perpendicular to the floor of the respective tray, and
the second connector of the second GPU card assembly is overlapped in the vertical direction by the first connector socket of the first riser.

17. The compute node of claim 3, wherein, for each of the first, second, third, and fourth trays: each GPU card assembly of the pair of GPU card assemblies of the respective tray is a full-length dual slot GPU card assembly.

18. The compute node of claim 3, wherein the first portion of the chassis comprises a base, a pair of side walls coupled to the base, a top cover coupled to the pair of side walls, a horizontal divider disposed between the top cover and the base, a first vertical divider disposed between the pair of side walls and extending between the horizontal divider and the base, and a second vertical divider disposed between the pair of side walls and extending between the horizontal divider and the top cover.

19. The compute node of claim 18, wherein the first and second latches are coupled to the top cover and the third and fourth latches are coupled to the horizontal divider.

20. The compute node of claim 3, wherein each of the first, second, third, and fourth trays is a modular component that is detachably coupled to the front side of the chassis.

* * * * *